United States Patent [19]

Kovacs et al.

[11] 4,444,620

[45] Apr. 24, 1984

[54] GROWTH OF ORIENTED SINGLE CRYSTAL SEMICONDUCTOR ON INSULATOR

[75] Inventors: Terrence Kovacs, North Plainfield; Loren N. Pfeiffer, Harding Township, Morris County, both of N.J.

[73] Assignee: Bell Telephone Laboratories, Incorporated, Murray Hill, N.J.

[21] Appl. No.: 531,353

[22] Filed: Sep. 12, 1983

[51] Int. Cl.³ ............................ B05D 5/12; B44C 1/22; C03C 15/00; H01L 21/306

[52] U.S. Cl. .................................... 156/657; 156/603; 156/612; 156/647; 156/659.1; 156/662; 156/DIG. 64; 156/DIG. 65; 156/DIG. 70; 156/DIG. 111; 427/86

[58] Field of Search ....................... 427/86, 93, 94; 156/600, 603, 608, 612, 613, 617 R, 617 SP, 620, 647, 650, 657, 659.1, 661.1, 662, DIG. 64, DIG. 65, DIG. 70, DIG. 73, DIG. 88, DIG. 111; 148/1.5, 171, 175, 187

[56] References Cited

U.S. PATENT DOCUMENTS 4,323,417 4/1982 Lam .................................... 156/613
4,371,421 2/1983 Fan ..................................... 156/624

OTHER PUBLICATIONS

*Integrated Circuit Technology*, T. A. Longo, Boston Technical Publishers, Inc., 1970.
"Zone-Melting Recrystallization of Encapsulated Silicon Films on SiO₂-Morphology and Crystallography", M. W. Geis et al., *Applied Physics Letters*, vol. 40, No. 2, Jan. 15, 1982, pp. 158-160.
"Solidification-Front Modulation to Entrain Subboundaries in Zone-Melting Recrystallization of Si on SiO₂", M. W. Geis et al., *Journal of the Electrochemical Society*, vol. 130, No. 5, May 1983, pp. 1178-1183.
"An Analysis of the Process of Recrystallization of Silicon Thin Films with Either a Scanning Laser or Strip Heater", H. E. Cline, *Journal of Applied Physics*, vol. 54, No. 5, May 1983, pp. 2683-2691.
"Silicon-on-Insulator for VLSI and VHSIC", *VLSI Electronics Microstructure Science*, H. W. Lam et al., Chapter 1, vol. 4, Academic Press, 1982, pp. 1-54, Ed. N. G. Einspruch.
"Lateral Epitaxial Growth of Thick Polysilicon Films on Oxidized 3-Inch Wafers", J. Narayan et al., Materials Research Society Symposia Proceedings, vol. 13, 1983, pp. 575-580.
"Zone-Melting Recrystallization of Si Films with a Moveable-Strip-Heater Oven", M. W. Geis et al., *Journal of the Electrochemical Society*, vol. 129, No. 12, Dec. 1982, pp. 2812-2818.

*Primary Examiner*—William A. Powell
*Attorney, Agent, or Firm*—Eugen E. Pacher

[57] ABSTRACT

Improvements in the lateral recrystallization of semiconductor material on buried insulator are disclosed. In particular, in the zone-melting process applied to seeded Si, it is found that scanning the molten zone in a [110] direction can result in substantially subboundary-free recrystallized material. Furthermore, appropriate patterning of the capping layer, to provide means for accommodating the volume change attending solidification of the semiconductor material, can result in significant decrease of defect density in laterally recrystallized semiconductor material on insulator. Especially advantageous results are produced when combining the improvements.

18 Claims, 5 Drawing Figures

GROWTH OF ORIENTED SINGLE CRYSTAL SEMICONDUCTOR ON INSULATOR

FIELD OF THE INVENTION

This invention pertains to the field of semiconductor material preparation, in particular, to processes for converting amorphous or polycrystalline semiconductor material into single crystal material, and to semiconductor device manufacture by a process comprising such conversion.

BACKGROUND OF THE INVENTION

Recently, there has been increased interest in recrystallizing thin layers of semiconductor, especially silicon, on a buried noncrystalline insulator layer, and this application is concerned with that version of semiconductor-on-insulator technology, and not with semiconductor-on-crystalline insulator (e.g., Si-on-sapphire) technology.

Electronic devices based on buried insulator structures offer promise of, inter alia, increased dielectric isolation, useful in, e.g., high voltage-high power devices, of reduced parasitic capacitance in integrated circuits, and of improved radiation hardness of devices. See, for instance, H. W. Lam et al, in *VLSI Electronics: Microstructure Science*, Vol. 4, N. G. Einspruch, editor, Academic Press (1982), pp. 1–54.

Typically, a layer of insulator material is formed on a semiconductor substrate, patterned, a layer of semiconductor material deposited thereover, the semiconductor layer melted in whole or in part, and one or more solidification fronts caused to advance laterally across the semiconductor layer. See, for instance, U.S. Pat. No. 4,323,417, issued Apr. 6, 1982, to H. W. Lam. Typically, a capping layer is formed atop the deposited semiconductor to, inter alia, prevent balling-up of molten semiconductor material. The capping layer typically comprises an oxide, e.g., $SiO_2$. See U.S. Pat. No. 4,371,421, issued Feb. 1, 1983, to J. C. C. Fan et al (Fan).

Various heat sources have been used to melt the thin semiconductor layers, including strip heaters, electron or laser irradiation, and irradiation with high intensity radiation from, e.g., tungsten halogen lamps. Various techniques for recrystallization are also known to the art. Among the techniques is a global melting approach, typically comprising simultaneous exposure of a whole wafer to high intensity visible and infrared radiation (G. K. Celler et al, in *Laser-Solid Interactions and Transient Thermal Processing of Materials*, J. Narayan et al, editors, North Holland, N.Y. (1983), pp. 575–580). A different technique comprises zone melting, i.e., relatively slow scan of a strip-like hot zone across the sample.

In the zone-melting method, the sample, e.g., a wafer, is typically coupled to a heat source that maintains the sample at a temperature slightly below the melting temperature of the semiconductor material, and a strip-like hot zone (in which the semiconductor material is molten) is scanned across the sample. A variety of means exists for producing the moving hot zone, e.g., a line-focused laser or other light source, or an electron beam. Graphite strip heaters are also used in the prior art. See, for instance, the Fan patent or M. W. Geis et al, *Journal of the Electrochemical Society: Solid State Science and Technology*, Vol. 129(12), pp. 2812–2818 (1982).

The prior art shows that it is possible, by means of the zone-melting technique, to produce on buried $SiO_2$ recrystallized (100)-oriented Si that is essentially free of large-angle grain boundaries. However, it appears that the recrystallized Si produced by prior art zone-melting techniques contains low-angle grain boundaries, often referred to as subboundaries, i.e., grain boundaries involving changes of crystal orientation of less than about 1 degree. See, for instance, M. W. Geis et al, *Applied Physics Letters*, Vol. 40(2), pp. 158–160 (1982). Since the presence of a subboundary within the active region of an electronic device, e.g., a transistor, is considered to be potentially detrimental to device performance, and subboundaries thus may reduce the manufacturing yield for devices produced in such recrystalline material, workers in the field have expended considerable effort on remedying this situation. However, to the best of our knowledge, up to now it has not been possible to produce subboundary-free Si films on buried $SiO_2$ by the zone-melting method.

In order to circumvent the problem posed by the ubiquitous subboundaries, it has recently been proposed to "entrain" the subboundaries, i.e., cause them to be formed at predetermined locations in the layer. According to the proposal, this can be achieved by spatially modulating the layer temperature, e.g., by forming on top of the sample a grating that locally enhances either the absorption or reflection of the radiation incidence from the strip heater (M. W. Geis et al, *Journal of the Electrochemical Society: Solid State Science and Technology*, Vol. 130(5), pp. 1178–1183 (1983)).

As discussed in the prior art, it is currently thought that subboundaries arise when large facets form at the solidification front. In particular, such facets form in thin (i.e., about 1 $\mu$m or less) unseeded Si layers that spontaneously grow with (100) orientation normal to the film, and with a [100] direction substantially parallel to the scan direction, as well as in seeded (100) Si layers. The latter are customarily grown by scanning along a [100] direction of the seed. The thus formed facets are thought to intersect the (100) surface along [110] directions, and are also thought to be bounded by (111) planes. Subboundaries are thought to originate at the interior corners of the faceted front where two (111) planes meet (ibid., pp. 1179–1180).

Because of the substantial technological and economic importance of grain boundary-free (including subboundary-free) semiconductor material of high crystalline perfection on buried insulator, especially of Si on $SiO_2$, techniques for producing such material by lateral recrystallization would be of great value. This application discloses improved methods that can produce such material.

DEFINITIONS

By "patterning" of a layer of material on a substrate, we mean a procedure that produces a nonuniform layer having a predetermined pattern of voids penetrating to the substrate. Photolithography and etching are familiar patterning procedures, but the term is not intended to be limited to such subtractive patterning methods.

The orientation of a crystal surface is defined by the Miller indices (h, k, l) of the crystallographic plane parallel to the surface. A direction in a crystal surface is defined by means of the indices [u, v, w]. No distinction is made herein between indices referring to a particular plane (direction) and indices referring to a set of crystallographically equivalent planes (direction).

SUMMARY OF THE INVENTION

We have found that subboundary formation in capped, seeded, laterally recrystallized, zone-melted Si on buried insulator can be reduced or eliminated by scanning the hot zone substantially parallel to a [110] crystallographic direction of the seed.

We have also discovered that highly perfect, capped, laterally recrystallized semiconductor material on buried insulator can be produced if the cap is appropriately patterned. Although such patterning has been found to be most advantageously used in conjunction with the zone-melting technique, it is thought to be of benefit also with other techniques for lateral recrystallization of capped semiconductor films on buried insulator, e.g., with the above-mentioned global melting technique. Furthermore, we believe that patterning can be advantageously used in semiconductor/insulator systems other than Si/SiO$_2$, e.g., Ge, III-V or II-VI semiconductors such as GaAs, InP, and ZnS on oxides (including, where applicable, native oxide), nitrides, carbides, or borides.

BRIEF DESCRIPTION OF THE DRAWINGS

Like numerals are used to identify like elements in the figures.

DETAILED DESCRIPTION

Because the performance of semiconductor electronic devices depends, inter alia, on the use of highly perfect, i.e., defect-free, semiconductor material, methods for producing such material have been of great importance in the development of the semiconductor industry. We have discovered improvements in the method of lateral recrystallization of semiconductors on buried insulator that allow formation of material of greatly improved crystalline perfection. For instance, we have produced subboundary-free Si layers of about 30 $\mu$m thickness on buried SiO$_2$ that had a Rutherford backscattering spectroscopy (RBS) channeling-to-random ratio $\chi_{min}$ of 3% in the [100] direction, which is as low as ratios obtained from the best bulk single crystal silicon in that direction.

We will now discuss one aspect of the invention, namely, the appropriate choice of hot zone scan direction. This aspect of the invention is applicable to the zone-melting lateral recrystallization technique, or, more generally, to recrystallization techniques in which a solidification front is caused to move in a predetermined direction across the sample. And although the practice of this aspect may produce improvements in the crystalline perfection of semiconductor materials other than Si, the preferred application is in the seeded growth of (100) Si on SiO$_2$.

We have found that the incidence of subboundaries in (100)-oriented seeded recrystallized Si on SiO$_2$ can be markedly reduced, or the subboundaries even eliminated, by scanning the hot zone substantially in a [110] direction, as determined in reference to the crystal orientation of the seed region(s), instead of in a [100] direction, as is commonly done in the prior art. Although it is believed that it is not essential that the scan direction be exactly coincident with a [100] crystallographic direction, we believe that the deviation preferably should not exceed about 10 degrees.

Figure 1:
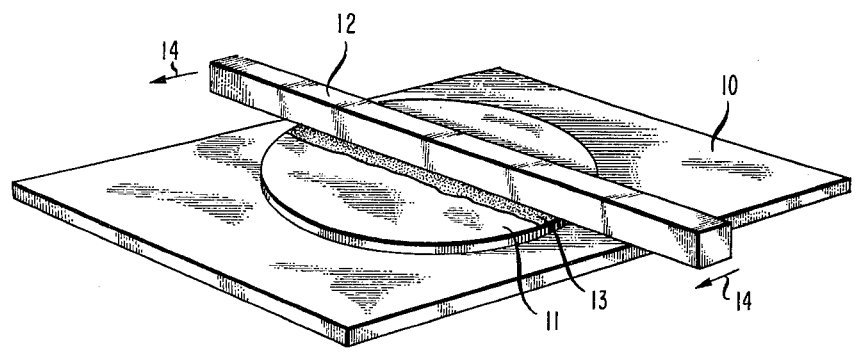
FIG. 1 schematically illustrates strip heater zone-melting apparatus.

Exemplary apparatus useful for the practice of the zone-melting technique is schematically shown in FIG. 1, wherein sample wafer 11 is shown on lower heater 10, and strip heater 12 is scanned across the sample in scan direction 14 normal to the long direction of hot zone 13 created by the strip heater. In typical practice of the invention, the lower heater maintains the semiconductor sample at a temperature slightly below the melting point of the semiconductor material, and the heat input to the sample from the strip heater is adjusted to produce a molten zone that extends to the buried insulator layer in the sample.

Although the discussion herein will generally be in terms of a molten zone produced by means of a strip heater, it will be understood that the invention is not so limited and that the molten zone can be produced by other appropriate means. A theoretical analysis of lateral recrystallization by means of a moving hot zone is given in H. E. Cline, *Journal of Applied Physics*, Vol. 54(5), pp. 2683–2691 (1983). And, of course, other variations of the basic apparatus are possible. For instance, we have generally not placed the wafer directly onto the lower heater but instead have coupled it radiantly to a planar graphite heater disposed underneath the sample wafer.

EXAMPLE 1

Figure 2:
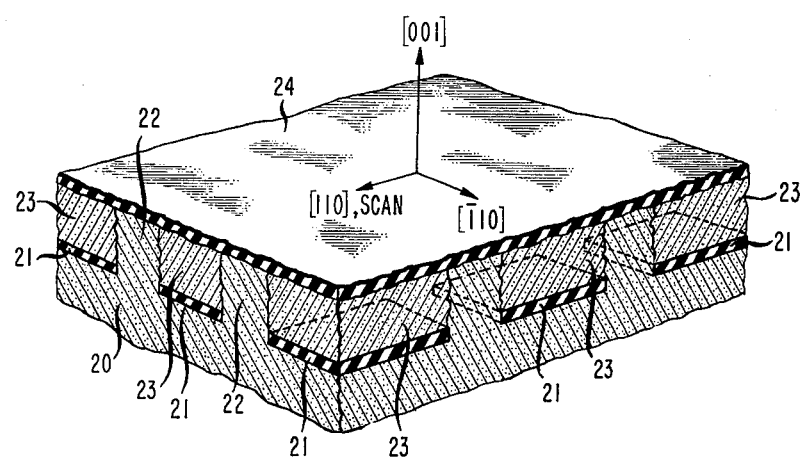
FIG. 2 depicts a capped, as deposited, semiconductor layer over buried insulator regions.

On a Czochralski-grown single crystal (100) Si wafer, 0.7 mm thick and 75 mm in diameter, doped n-type to about $1.10^{15}$ carriers/cm$^3$, we grew a 3.5 $\mu$m thick layer of thermal oxide by a standard method. The oxide was patterned by photolithography and dry etching into a checkerboard pattern of alternating oxide squares of size ranging from 1.6 mm to 12.8 mm, with edges aligned along [110] crystal directions. A 33 $\mu$m thick n-type Si film with $1.10^{14}$ carriers/cm$^3$ was formed on the wafer by thermal decomposition of SiHCl$_3$ at about 1050° C. The surface of the deposited Si then was mechanically polished until smooth and planar, the layer thickness reduced thereby to about 27 $\mu$m. This was followed by deposition onto the wafer by LPCVD of a 2 $\mu$m thick SiO$_2$ capping layer. This produced a buried oxide checkerboard structure similar to that shown schematically in FIG. 2, wherein 20 is the wafer substrate material, 21 is a buried insulator region, 22 and 23 are deposited semiconductor, and 24 is the capping layer. Regions 22 and 23 are chemically identical, but generally differ in structure, with 22 being typically single crystal and epitaxial with the substrate material, whereas regions 23 typically are polycrystalline. FIG. 2 also indicates some crystallographic directions as they apply to this discussion. Namely, [001] is normal to the wafer, [110] and [$\bar{1}$10] are substantially parallel to the checkerboard edges, with [110] substantially parallel to the scan direction.

Figure 3:
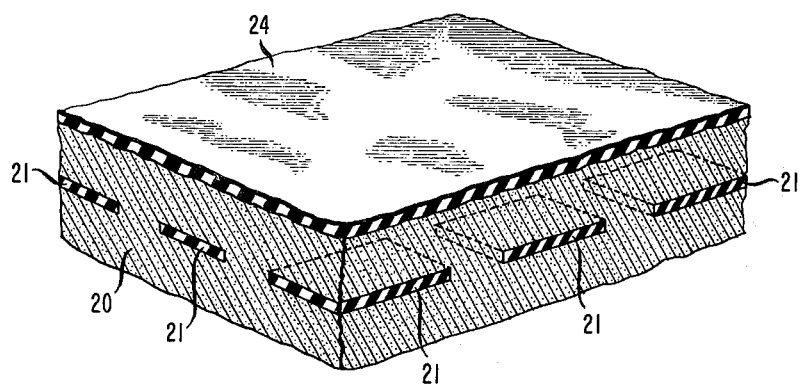
FIG. 3 shows a similar but recyrstallized semiconductor layer.

The thus prepared wafer was placed in a recrystallization chamber, the chamber pumped to about $10^{-7}$ Torr and backfilled with about 300 Torr Ar. The wafer was radiantly coupled to a graphite heater and heated from below to about 1210° C., with a 5° C. nonuniformity from center to edge, as determined with an optical pyrometer corrected for the wafer emissivity. A graphite wire of 1×1 mm cross section was heated to about 2240° C. and scanned at 2.0 mm/sec across the wafer at a clearance of about 0.75 mm. This caused a uniform molten zone to move across the wafer under and slightly behind the moving wire heater. After completion of the scan, the wafer was cooled at a rate of about 1° C./sec. The Si film between the SiO$_2$ layers had melted uniformly everywhere on the wafer, the melt stopped at the buried oxide, but extended slightly into the substrate in and very near the buried-oxide-free seed regions. Etching by means of the well-known Schimmel etchant to reveal grain boundaries and dislocations showed that the previously polycrystalline regions had been transformed into single crystal material, as indicated schematically in FIG. 3. Recrystallized regions of typically about 1 mm$^2$ size were found to be substantially free of subboundaries. The variation in thickness of the recrystallized material was found to be less than 10 μm, indicating reduced mass transport as compared to prior art work on recrystallized thick films. The recrystallized material, however, contained dislocations, with their density increasing gradually in the scan direction, but with a very low density in the top 2 to 3 μm and in the bottom 4 to 5 μm of the recrystallized material.

EXAMPLE 2

A 30 μm capped Si layer was grown on buried SiO$_2$ by a procedure substantially as described in Example 1. The zone melting conditions were also as described in Example 1, with the exceptions that the strip heater was aligned along the [100] direction of the substrate (diagonal to the squares of buried oxide), and the scan direction was parallel to the [010] crystallographic direction. Schimmel etching revealed subboundaries aligned along the [010] direction, with average spacing of about 110 μm.

EXAMPLE 3

A 0.5 μm thick Si film was encapsulated between SiO$_2$ layers, substantially as described in Example 1, but with the buried SiO$_2$ layer being unpatterned. The Si film was recrystallized, using seeding by means of a scratch extending through cap, deposited Si and buried SiO$_2$ to the Si substrate. The hot zone was scanned in a [110] direction of the substrate crystal. The recrystallization film showed an extended network of subboundaries, of lateral spacing 20 to 60 μm.

Example 3 demonstrates the fact that film thickness, as well as scan direction, is an important factor in the suppression of subboundaries in the recrystallized Si on insulator. We believe that the suppression of subboundary growth by the improved zone-melting method is most pronounced in layers at least about 10 μm thick, although beneficial results may be obtainable at any thickness.

Our invention can, of course, be practiced with buried insulator configurations other than the simple planar ones described above. For instance, a configuration of importance in device manufacture is schematically depicted in FIG. 4, wherein buried insulator regions 40 form tubs embedded in the substrate material and covered by deposited semiconductor, in turn covered by a capping layer.

EXAMPLE 4

Figure 4:
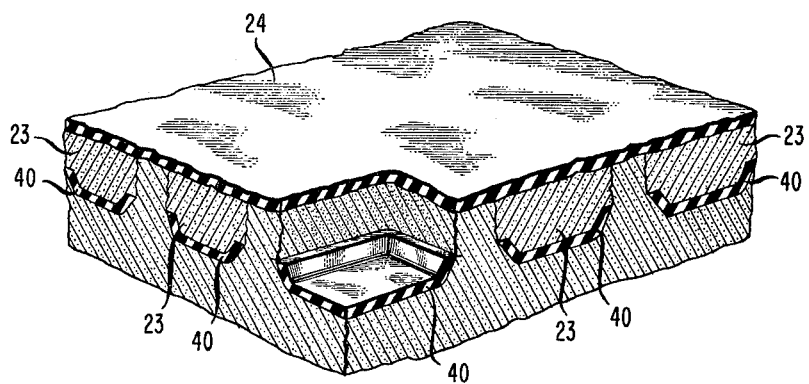
FIG. 4 shows a capped, as deposited, semiconductor material on buried nonplanar insulator regions.

A structure similar to that shown in FIG. 4 was created by etching 50 μm deep rectangular depressions, of size 0.5 mm×0.7 mm, with walls sloping at about 45°, into a (100) Si substrate wafer. The depressions were arranged pairwise in rows, the members of each pair spaced about 0.1 mm, pairs about 3 mm, and rows about 6 mm, apart. The depressions had [110] oriented sides. After formation of a 3.5 μm continuous SiO$_2$ layer on the substrate surface, the oxide layer was patterned so as to retain SiO$_2$ only in the tub regions. After CVD deposition of about 80 μm of Si, a 2 μm thick SiO$_2$ capping layer was formed on the deposited Si, and a hot zone scanned across the wafer in the [110] direction parallel to the rows. During zone melting, the substrate was maintained at about 1135° C., and the strip heater scanned at 0.5 mm/sec. The recrystallized material was found to be substantially free of subboundaries, with a lower defect density than that of Example 1. Unless otherwise noted, the procedures used in this example were substantially as described in Example 1.

Figure 5:
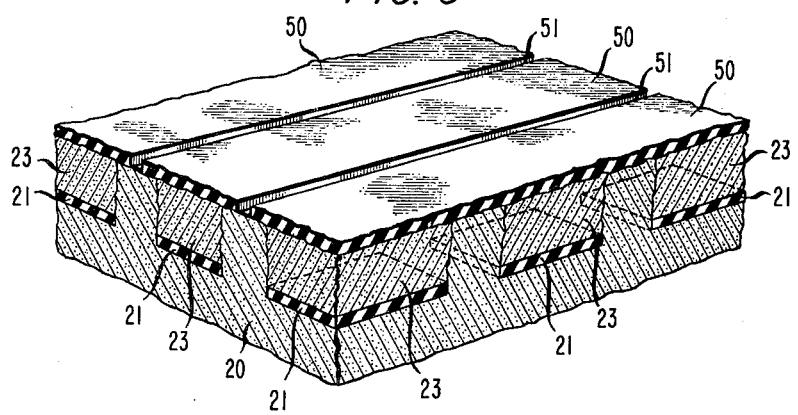
FIG. 5 shows a patterned cap according to the invention over as-deposited semiconductor material, with buried planar insulator regions.

Next, we will discuss the second aspect of the invention, the use of a patterned capping layer. A patterned cap is depicted in FIG. 5, wherein cap regions 50 are separated by voids 51.

As is well known, the capping layer atop the layer of semiconductor material serves to contain the molten material, i.e., to prevent its balling-up due to surface tension. See, for instance, FIG. 3 of the Fan patent, op. cit. A capping layer may furthermore prevent loss of a volatile constituent of a compound semiconductor, e.g., of P in InP, or even excessive vaporization of an elemental semiconductor, e.g., Si, or of a dopant therein. Typical capping layers are oxides, especially the native oxide of the capped semiconductor, but other materials may also be useful, e.g., nitrides, borides or carbides. Furthermore, a multilayer capping structure may have advantages, as disclosed in the Fan patent.

We have discovered that appropriate patterning of the capping layer prior to recrystallization can result in recrystallized semiconductor material of substantially improved crystal perfection. Semiconductors typically undergo a volume change upon solidification (e.g., Si expands in volume by about 10%), likely to result in considerable stress upon solidification of a layer constrained by a solid capping layer. We therefore believe that the observed improvement of crystalline quality is due to stress relief provided by the patterning.

Generally, the patterning should produce localized cap-free semiconductor surface regions ("voids"), such that the volume change attending melting or solidification can, for instance, be accommodated by movement of molten material into (or out of) these voids. Although substantial latitude exists with regard to the details of the patterning, we believe that, for instance, isolated regions of capping material should not be so small as to become completely detached from solid material during zone melting, to avoid their drifting off, as well as, possibly, loss of their ability to prevent balling-up of the semiconductor underlayer.

Patterns that fulfill the requirements are, for instance, strips of capping material running substantially in the scan direction, with narrow voids separating them, or arrays of small windows etched through the capping layer. In general, we believe that the patterning should be such that on average (i.e., considering a sufficiently large area, e.g., 1 cm$^2$) at least 95% of the semiconductor surface to be recrystallized remains capped. Furthermore, we believe that preferably the voids should have at least one small dimension, so as not to strongly affect the absorption of energy from the strip heater or other energy source, and to minimize evaporation of the semiconductor. We believe that a range of the small dimension of the void of about 1–20 μm gives advantageous results. A suitable pattern would be, for instance, 1 mm wide strips of capping material separated by 10 μm wide trenches etched through the cap material. The pattern of the capping layer can be, but need not be, correlated with the pattern of seed regions in the buried insulator layer. That is to say, uncapped regions can be above seed regions as well as above buried insulator regions.

The pattern can be produced by any appropriate technique in any capping layer, including multilayer caps. For instance, we have created a strip pattern (e.g., about 1800 μm wide strips separated by about 80 μm wide voids) in $SiO_2$ by means of scribing through the 2 μm $SiO_2$ cap with a diamond point. A preferred approach is to pattern the capping layer by means of photolithography and dry or wet etching techniques. Such techniques are well known in the art.

Although a preferred application of the inventive patterning is in the recrystallization of Si on $SiO_2$ by means of the zone-melting technique, the patterning of the capping layer may also be usefully applied in other lateral recrystallization methods, e.g., the global melting method for Si as described by G. K. Celler et al, op. cit., as well as with other semiconductor or insulator systems, e.g., Ge, or III-V or II-VI compounds such as GaAs, InP, or ZnS. These semiconductor layers may be sandwiched between various buried insulator layers and various caps, e.g., oxides, nitrides, carbides, or borides, in any combination subject to the condition that the melting point of the semiconducting film be lower than the melting or softening point of the enveloping layers.

EXAMPLE 5

A capped Si film on a (100) oriented Si substrate, with buried oxide regions in a checkerboard pattern, was prepared substantially as described in Example 1. The $SiO_2$ capping layer was patterned by standard photolithography and etching methods into long strips, varying in width from 50 μm to 500 μm, separated by 5 to 20 μm voids, the strips running substantially parallel to the scan direction. After scanning the strip heater across the wafer in a [110] direction in a manner substantially as described in Example 1, and removing the remaining capping material by etching in buffered HF, the recrystallized regions were found to be essentially free of grain boundaries, subboundaries, and other extended defects. RBS yielded a $\chi_{min}$ of 3% for this material. This is to be compared with observed $\chi_{min}$ of 15–45% for similarly prepared material without patterning of the capping layer.

Semiconductor material on insulator recrystallized according to the invention can advantageously be employed for device manufacture, e.g., manufacture of electronic devices such as MOSFET or bipolar transistors, optoelectronic devices, or integrated optics devices. The necessary manufacturing techniques, including photolithography, etching, doping by indiffusion or implantation, material deposition by evaporation, sputtering, CVD, LPCVD, thermal oxidation, etc., are well known to those skilled in the art and need no recitation here. See, for instance, *Integrated Circuit Technology*, T. A. Longo, Boston Technical Publishers, Inc., Cambridge, Mass. (1970). A MOSFET employing Si on $SiO_2$ is, for instance, shown schematically in FIG. 13B of the Fan patent, incorporated herein by reference, together with the description of the Figure.

It will be appreciated by those skilled in the art that, although our invention is preferably practiced with a single crystal (doped or undoped) semiconductor substrate underlying the insulator layer, other arrangements are possible. For instance, if "external" seeds are employed, then the substrate need not be single crystalline or, in fact, need not be a semiconductor. For a disclosure of external seeding, see the Fan patent. Furthermore, it will be appreciated that the buried insulator need not necessarily be patterned, or be patterned uniformly. At least in principle, a narrow region of contact between the single crystal semiconductor substrate and the deposited semiconductor material, e.g., a contact strip around the periphery of a wafer, can serve as seed region for the lateral recrystallization of the deposited semiconductor material. All such obvious modifications are contemplated to be within the scope of our invention.

What is claimed is:

1. Method for producing a semiconductor device, the method comprising producing a body comprising a single crystal substrate consisting substantially of Si, the substrate having a major surface oriented substantially parallel to a (100) crystal plane of the substrate, the method comprising
   (a) forming an insulator first layer on at least a part of the major surface,
   (b) providing at least one major surface region that is not covered by the first layer, the region to be referred to as the "seed" region,
   (c) forming a second layer consisting substantially of Si on at least a part of the first layer and at least a part of the seed region,
   (d) forming a capping third layer on at least a part of the second layer,
   (e) heating the second layer to melt a part of the second layer, thereby producing at least one solid-liquid interface, and
   (f) causing the interface to move across at least part of the second layer, thereby causing solidification of second layer material at the interface,
   characterized in that
   (g) the interface is caused to move in a direction that is within about 10° of a [110] substrate crystal direction.

2. Method of claim 1, wherein the seed region is formed by subtractive patterning of the first layer.

3. Method of claim 1, wherein the first layer consists essentially of $SiO_2$.

4. Method of claim 1, wherein the third layer comprises a $SiO_2$ layer.

5. Method of claim 1, wherein the second layer is heated by means comprising a strip heater spaced apart from the third layer.

6. Method of claim 1, wherein a first heater brings the substrate to a temperature slightly below the melting point of the second layer material and a second heater is translated, in spaced apart relation, across the third layer, thereby melting a zone of second layer material and translating the zone.

7. Method for producing a semiconductor device, the method comprising producing a body comprising a single crystal substrate consisting substantially of a first semiconductor material, the substrate having a major surface, the method comprising
  (a) forming an insulator first layer on at least a part of the major surface,
  (b) providing at least one major surface region that is not covered by the first layer, the region to be referred to as the "seed" region,
  (c) forming a second layer, consisting substantially of the first semiconductor material, on at least a part of the first layer and at least a part of the seed region,
  (d) forming a capping third layer on at least a part of the second layer,
  (e) heating the semiconductor second layer to melt at least a part of the second layer, and
  (f) solidifying the molten part of the second layer, characterized in that
  (g) the capping third layer is patterned, the pattern adapted for providing means for accommodating a volume change of the solidifying material.

8. Method of claim 7, wherein the capping layer is patterned such that, on average, at least about 95% of the second layer area to be recrystallized is covered by capping layer material.

9. Method of claim 7, wherein the first semiconductor material is selected from the group consisting of Si, Ge, III-V semiconductors, and II-VI semiconductors.

10. Method of claim 8, wherein the first semiconductor material is Si, the first layer consists substantially of $SiO_2$, and the third layer comprises a layer consisting substantially of $SiO_2$.

11. Method of claim 10, wherein at least a major part of the second layer is melted substantially simultaneously by means comprising visible radiation.

12. Method of claim 1, wherein the capping third layer is patterned, the pattern adapted for providing means for accommodating a volume change of the solidifying material.

13. Method of claim 12, wherein the third layer is patterned such that, on average, at least about 95% of the second layer material to be recrystallized is covered by third layer material.

14. Method of claim 13, wherein the patterned third layer comprises strips oriented with their long dimension substantially parallel to the direction of motion of the interface.

15. Method of claim 13, wherein the patterned third layer comprises a multiplicity of isolated windows extending to the second layer.

16. Method of claim 1, wherein the semiconductor device is selected from the group consisting of electronic devices, integrated optics devices, and optoelectronic devices.

17. Method of claim 7, wherein the semiconductor device is selected from the group consisting of electronic devices, integrated optics devices, and optoelectronic devices.

18. Method of claim 12, wherein the semiconductor device is selected from the group consisting of electronic devices, integrated optics devices, and optoelectronic devices.

* * * * *